United States Patent
Xu et al.

(10) Patent No.: US 7,164,566 B2
(45) Date of Patent: Jan. 16, 2007

(54) ELECTROSTATIC DISCHARGE PROTECTION DEVICE AND METHOD THEREFORE

(75) Inventors: Hongzhong Xu, Gilbert, AZ (US); Beth A. Baumert, Scottsdale, AZ (US); Richard T. Ida, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 322 days.

(21) Appl. No.: 10/805,119

(22) Filed: Mar. 19, 2004

(65) Prior Publication Data

US 2005/0207077 A1    Sep. 22, 2005

(51) Int. Cl.
*H02H 9/00* (2006.01)
*H01L 23/62* (2006.01)
(52) U.S. Cl. .......................... 361/56; 257/362
(58) Field of Classification Search ............. 361/56, 361/110, 111, 91; 257/362, 363
See application file for complete search history.

(56) References Cited

U.S. PATENT DOCUMENTS 4,367,509 A * 1/1983 Snyder et al. ............ 361/91.5

6,365,462 B1 * 4/2002 Baliga ..................... 438/270
6,804,095 B1 * 10/2004 Kunz et al. ................. 361/56

OTHER PUBLICATIONS

Julian Z. Chen et al., Design and Layout of a High ESD Performance NPN Structure for Submicron BiCMOS/Bipolar Circuits, 1996, p. 227-232.

* cited by examiner

*Primary Examiner*—Brian Sircus
*Assistant Examiner*—Boris Benenson
(74) *Attorney, Agent, or Firm*—Ingrassia Fisher & Lorenz

(57) ABSTRACT

Methods and apparatus are provided an electrostatic discharge (ESD) protection device having a first terminal and a second terminal. The ESD protection device comprises a vertical transistor having a collector coupled to the first terminal, a base, and an emitter coupled to the second terminal. A zener diode has a first terminal coupled to the first terminal of the ESD protection device and a second terminal coupled to the base of the vertical transistor. Subsurface current paths are provided to redistribute current from a surface of the vertical transistor in an ESD event. The method comprises generating an ionization current when a zener diode breaks down during an ESD event. The ionization current density from a surface zener diode region is reduced. The ionization current enables a transistor to dissipate the ESD event.

20 Claims, 2 Drawing Sheets

ELECTROSTATIC DISCHARGE PROTECTION DEVICE AND METHOD THEREFORE

TECHNICAL FIELD OF THE INVENTION

The present invention generally relates to electrostatic discharge protection, and more particularly relates to an electrostatic discharge structure having a zener diode triggered bipolar transistor.

BACKGROUND OF THE INVENTION

An integrated circuit is prone to damage by electrostatic discharge (ESD) throughout its life cycle, from manufacture to use in a product. An electrostatic discharge event is a high energy impulse having a voltage amplitude typically measuring thousands of volts that can physically and permanently damage a semiconductor device. In general, an electrostatic discharge event is coupled to circuitry of an integrated circuit through the input/output (I/O) of the device. The I/O are the interface of the integrated circuit for receiving/sending signals from off chip. The circuitry of the integrated circuit that couples to an I/O can be damaged unless protected by an electrostatic discharge protection circuit or device. ESD protection of an integrated circuit has always been a critical issue as the semiconductor industry continues the trend of shrinking transistor geometries to maximize circuit density per square inch of silicon. Forming a smaller transistor requires wafer processing having reduced critical dimensions and thinner material layers making it more sensitive to damage from ESD.

ESD devices are disabled during normal operation of an integrated circuit. An ESD event at one of the I/O triggers a corresponding ESD circuit to dissipate the energy of the ESD event before damage occurs to the integrated circuit. Typically, this is achieved by enabling a device or devices having an extremely low impedance coupled to ground. In other words, the high voltage impulse is shunted to ground through the ESD circuit. The ESD circuit is disabled once the energy is dissipated or the voltage at the I/O falls to a safe level. Ideally, an ESD circuit does not load the I/O significantly when disabled, responds rapidly to an ESD event, takes up minimum area, and has a low impedance when enabled.

FIG. 1 is a schematic diagram of a prior art electrostatic discharge (ESD) protection circuit 10. ESD protection circuit 10 is a model of an integrated device structure that is coupled to the I/O pads of an integrated circuit to protect against electrostatic discharge. ESD protection circuit 10 has a terminal 15 and a terminal 20. Terminal 15 couples to circuitry of an integrated circuit and corresponds to an I/O of the device. The terminal 20 of ESD protection circuit 10 is coupled to ground. ESD protection circuit 10 comprises a transistor 25, a zener diode 30, and a resistor 35. Transistor 25 includes a collector coupled to terminal 15, a base, and an emitter coupled to terminal 20. Zener diode 30 has a first terminal coupled to terminal 15 and a second terminal coupled to the base of transistor 25. A resistor has a first terminal coupled to the base of transistor 25 and a second terminal coupled to terminal 20. In an embodiment of ESD protection circuit 10, zener diode 30 is integrated into the structure of transistor 25.

An integrated circuit typically has a specified voltage range under which it can operate. A voltage applied to terminal 15 within the specified voltage range will not damage the internal circuitry of the integrated circuit coupled to the I/O. In general, the specified voltage range is conservative and a greater voltage (but less than $BV_{DSS}$) can be applied to terminal 15 without damage. Zener diode 30 is designed to have a breakdown voltage greater than the specified voltage range. Zener diode 30 conducts no current when a voltage applied to terminal 15 is within the specified voltage range. Resistor 35 couples the base of transistor 25 to ground under this condition. Transistor 25 is off because the base-emitter junction is not forward biased having both the base and the emitter coupled to the same voltage potential (ground). Thus, transistor 25 and zener diode 30 are disabled and conduct no current under normal operation of the integrated circuit.

An ESD event coupled to terminal 15 is a fast rise time, voltage impulse, having a magnitude that measures thousands of volts if the impulse is not attenuated. ESD protection circuit 10 is enabled by the voltage impulse and dissipates the energy corresponding to the electrostatic discharge before damage to the circuitry coupled to terminal 15 occurs. An impact ionization current is generated in zener diode 30 when the voltage impulse exceeds the breakdown of the device.

The impact ionization current increases as avalanche multiplication occurs in zener diode 30. The impact ionization current from zener diode 30 couples through resistor 35 and generates a rising voltage at the base of transistor 25. Transistor 25 is enabled when the base voltage rises to a voltage that forward biases the base-emitter junction of the device. Transistor 25 is a high current gain device. Once enabled, transistor 25 rapidly sinks current from the ESD event thereby dissipating the energy of the impulse which results in the voltage being clamped to a level that protects the circuitry coupled to terminal 15.

FIG. 2 is a cross-sectional view of the prior art electrostatic discharge (ESD) protection circuit 10 of FIG. 1. In general, ESD protection circuit 10 couples to and is formed in proximity to an I/O pad of an integrated circuit. ESD protection circuit 10 has terminal 15 coupled to the I/O pad of the integrated circuit and terminal 20 coupled to ground. An n-type epitaxial layer 110 overlies a p-type substrate 105. An isolation region 120 defines the active area in which ESD protection circuit 10 is formed. Isolation region 120 is a p-type region that is formed in a ring shape and is coupled to ground. The active area is interior to the ring shape.

Transistor 25 of FIG. 1 comprises a base region 130, an emitter region 145, and a collector. The collector is epitaxial layer 110 in the active area. Transistor 25 is a high current gain vertical transistor. Base region 130 is p-type and is formed in epitaxial layer 110. Emitter region 145 is n-type and is formed in base region 130. A p-type region 140 is formed at the surface of base region 130 in a ring shape and surrounds emitter region 145. P-type region 140 is a low resistance base contact to base region 130. P-type region 140 and emitter region 145 are coupled to terminal 20. As mentioned previously, terminal 20 is coupled to ground.

A buried layer 115 and n-type region 125 combine to form a low resistance path for collector current of transistor 25. Buried layer 115 underlies base region 130 and is formed at the interface between substrate 105 and epitaxial layer 110. N-type region 125 is a ring shaped region that surrounds base region 130. N-type region 125 is a deep n+ region formed in epitaxial layer 110 in the active area that forms a low resistance path from a surface of epitaxial layer 110 to buried layer 115. A heavily doped n-type region 135 is formed in region 125 that couples to terminal 15 of ESD protection circuit.

Zener diode 30 of FIG. 1 comprises a p-type region 150, epitaxial layer 110, and n-type region 125. P-type region 150 overlies a boundary of base region 130 and epitaxial layer 110. P-type region 150 couples to base region 130 and is formed in a ring shape around the periphery of base region 130. P-type region 150 has a higher doping concentration than base region 130. As shown in FIG. 1, zener diode 30 is coupled in parallel with the collector-base of transistor 25. The spacing between p-type region 150 and n-type region 125 and the doping concentrations of the device components of zener diode 30 play a role in determining what voltage zener diode 30 breaks down.

Resistor 35 of FIG. 1 corresponds to the inherent resistance of base region 130. In an ESD event, impact ionization current is generated by zener diode 30 when the breakdown voltage of zener diode 30 is exceeded. The impact ionization current is coupled to base region 130. Note that both emitter region 145 and p-type region 140 are coupled to ground through terminal 20 of ESD protection circuit 10. The inherent resistance of base region 130 produces a voltage drop as impact ionization current is conducted that forward biases the base-emitter junction of transistor 25. Upon enabling transistor 25, a portion of the impact ionization current is base current for the device. The base current is multiplied by the current gain of transistor 25 which rapidly dissipates the energy of the ESD event and clamps the voltage from exceeding a value that can damage circuitry coupled to terminal 15. The voltage at terminal 15 falls as transistor 25 dissipates the energy of the ESD event. Zener diode 30 stops conducting current when the voltage at terminal 15 falls below the breakdown voltage of the device. Transistor 25 is disabled when deprived of the current from zener diode 30 thus returning to the state prior to the ESD event with no current being conducted by zener diode 30 and transistor 25.

FIG. 3 is a graph of a transmission pulse line characteristic corresponding to ESD protection circuit 10 of FIG. 2. Transmission pulse line testing provides a pulse similar to an ESD event to an ESD protection circuit. The voltage and current coupled to the ESD protection circuit is monitored. A curve on the graph relates to measurements on an ESD protection circuit similar in structure to that shown in FIG. 2 and measuring 52.5 microns on a side. Voltage is displayed on the x-axis and current on the y-axis.

The voltage impulse is clamped to a voltage magnitude less than 50 volts as the zener diode breaks down providing impact ionization current to enable the transistor. The voltage rapidly falls to approximately the breakdown voltage of the zener diode plus a base-emitter junction voltage. The test equipment measures the maximum current that can be handled by ESD protection circuit before failure. The point of failure is represented by dot 210 on the curve which corresponds to a current slightly less than 4000 milliamperes.

Although not indicated by the graph, the failure mechanism typically results in damage at the base terminal of the ESD protection circuit. As mentioned previously, the transistor tested corresponds to the device shown in FIG. 2. The transistor tested is a vertical device comprising emitter region 145, base region 130, and epitaxial layer 110 (collector). The device structure shown also has parasitic lateral transistor component that is inherent to the design. It is believed that the failure at the base terminal of the device occurs due to high currents flowing near the surface of the transistor due to currents from the zener diode and the lateral transistor that couple to the base terminal. An ESD event of substantial energy produces a current at the base terminal due to the circuit structure that causes a failure in the ESD protection device.

Accordingly, it is desirable to provide an electrostatic discharge protection circuit capable of suppressing higher energy electrostatic events. It would be beneficial if the electrostatic discharge protection circuit had a smaller footprint. It would be of further benefit if the electrostatic discharge protection circuit did not require any special manufacturing steps. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
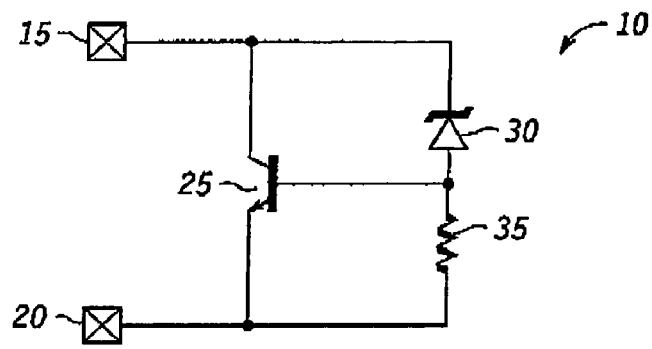
FIG. 1 is a schematic diagram of a prior art electrostatic discharge circuit.
Figure 2:
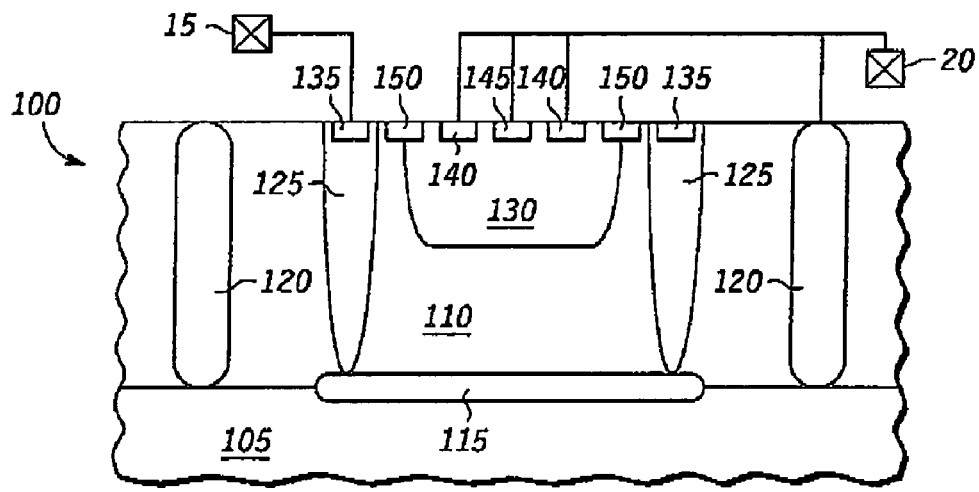
FIG. 2 is a cross-sectional view of a prior art electrostatic discharge (ESD) protection circuit corresponding to the schematic diagram of FIG. 1.

A zener diode triggered bipolar transistor electrostatic discharge (ESD) protection circuit similar to that shown in FIG. 1 is capable of being formed on both existing and future wafer process flows. In general, cost is a factor in the design of an ESD protection circuit. Typically, an electrostatic discharge protection circuit is made from process steps and masks that exist in the wafer flow. The use of extra mask or wafer process steps to optimize performance of the ESD protection circuit performance is rarely justified due to the increased cost of manufacture. Another variable affecting the cost of ESD protection circuit is the size of the structure for a given performance level. ESD protection circuits can take up a substantial amount of silicon area. A reduction in the area of an ESD protection circuit can decrease the cost to manufacture by minimizing the die area.

Figure 4:
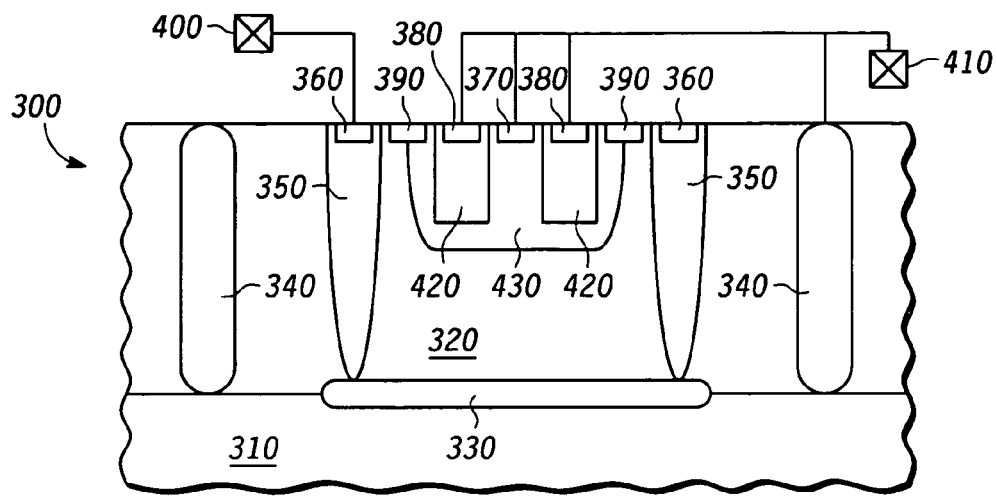
FIG. 4 is a cross-sectional view of an electrostatic discharge (ESD) protection circuit in accordance with the present invention.

FIG. 4 is a cross-sectional view of an electrostatic discharge (ESD) protection circuit 300 in accordance with the present invention. ESD protection circuit 300 prevents an electrostatic discharge from damaging an integrated circuit. In general, an ESD protection circuit is placed at each input/output (I/O) of an integrated circuit. ESD protection circuit 300 is enabled by an ESD event to dissipate the energy of the discharge before circuitry of the integrated circuit is damaged. For example, complementary metallic oxide semiconductor (CMOS) transistors have a thin gate oxide that is easily damaged by a high voltage pulse. In an embodiment of the structure, an ESD event is shunted to ground through ESD protection circuit 300 such that the peak voltage and duration of the ESD event is reduced to a level that does not damage circuitry of the integrated circuit.

ESD protection circuit 300 includes a terminal 400 and a terminal 410. In an embodiment of the structure, terminal 400 couples to an I/O of the integrated circuit and terminal 410 couples to ground. ESD protection circuit 300 comprises a zener diode and a bipolar transistor. The zener diode is coupled across the collector-base junction of the bipolar transistor similar to that shown in FIG. 1. In an embodiment of ESD protection circuit 300, the bipolar transistor is a vertical npn transistor having a collector coupled to terminal 400, a base, and an emitter coupled to terminal 410. The zener diode has a cathode and anode respectively coupled to the collector and the base of the transistor.

In an embodiment of ESD protection circuit 300, the integrated structure is formed in an n-type epitaxial layer 320 that overlies a p-type substrate 310. An isolation region defines the active area for ESD protection circuit 300. In an embodiment of ESD protection circuit 300, the isolation region is a p-type region 340 formed in epitaxial layer 320. P-type region 340 is a deep p-type region that extends from a surface of epitaxial layer 320 into substrate 310. In an embodiment of the device, p-type region 340 is formed in a ring shape that isolates and defines the active area of ESD protection circuit 300 as epitaxial layer 320 interior to the ring shape. It should be noted that ESD protection circuit 300 is not limited to p-type region 340 but can be fabricated using other isolation strategies such as a deep trench filled with dielectric material or undoped polysilicon that are well known to one skilled in the art. Substrate 310 and p-type region 340 are coupled to ground.

An n-type buried layer 330 partially underlies epitaxial layer 320 in the active area. Buried layer 330 is formed at the approximate interface between substrate 310 and epitaxial layer 320. An n-type region 350 is formed in epitaxial layer 320. N-type region 350 extends from a surface of epitaxial layer 320 to n-type buried layer 330. Epitaxial layer 320 within the boundary set up by n-type region 350 and n-type buried layer 330 is the collector of the transistor. N-type region 350 and n-type buried layer 330 are heavily doped to form a low resistance path for collector current of the vertical npn transistor. In an embodiment of ESD protection circuit 300, n-type region 350 is formed in a ring shape. Buried layer 330 underlies epitaxial layer 320 interior to the ring shape of n-type region 350. In an embodiment of the transistor, an n-type region 360 is formed in n-type region 350 for coupling to metal interconnect that couples terminal 400 of ESD protection circuit 300 to an I/O of the integrated circuit.

A p-type base region 430 is formed in the active area within the interior of the ring shape of n-type region 350. Base region 430 is formed in epitaxial layer 320 and spaced a predetermined distance from n-type region 350. A p-type region 390 is formed at a surface of epitaxial layer 320 overlying a boundary between base region 430 and epitaxial layer 320. P-type region 390 couples to p-type base region 430 and has a higher doping concentration than p-type base region 430. The zener diode of ESD protection circuit 300 comprises n-type region 350, epitaxial layer 320, and p-type region 390.

An n-type emitter region 370 is formed in base region 430. A p-type region 420 is formed into base region 430. In an embodiment of the transistor, p-type region 420 is formed in a ring shape that surrounds emitter region 370. P-type region 420 extends from the surface into base region 430. The depth of p-type region 420 is selected to redirect current from a lateral surface flow to a more vertical current flow. In general, p-type region 420 redistributes the current from an ESD event much deeper and more uniformly through base region 430 thereby reducing failure due to non-uniform current flow and current crowding. The resistance in the current flow path is also reduced by p-type region 420. In general, the depth of p-type region 420 is greater than 30% of the depth of base region to ensure that a substantial amount of the current flow is redistributed below the surface. Reducing the current density greatly increases the energy that ESD protection circuit 300 can dissipate before failure as will be shown hereinbelow. In an embodiment of the transistor, a p-type region 380 is formed in p-type region 420 for coupling to metal interconnect that couples to emitter region 370 and ground. A doping concentration of region 420 is higher than base region 430. Similarly, a doping concentration of region 380 is higher than region 420.

One embodiment of the transistor is described hereinbelow. Base region 430 is formed having a depth of approximately 2.8 microns and a doping concentration of approximately $2E16$ atoms/cm$^3$. P-type region 420 is formed to a depth of approximately 2 microns into base region 430. This gives p-type region 420 a substantial subsurface area that more uniformly distributes current flow in base region 430 to prevent high current densities at the surface. P-type region 420 has a doping concentration intermediate to base region 430 and p-type region 380 of approximately $3E16$ atoms/cm$^3$. P-type region 380 is heavily doped having a doping concentration of approximately $1E20$ atoms/cm$^3$ or higher. P-type region 380 is formed on the surface of p-type region 420, typically having a depth of approximately 0.2 microns.

Under normal operating conditions (no ESD event), the transistor and zener diode are disabled. Normal operating voltages applied to terminal 400 are insufficient to break down the zener diode. The base-emitter junction of the transistor comprising base region 430 and emitter region 370 are both coupled to ground. The base-emitter junction is not forward biased in this state, thus the transistor is off. In general, ESD protection circuit 300 does not represent a significant load to signals applied to the I/O common to terminal 400.

The zener diode sets a voltage at which ESD protection circuit 300 is enabled. As mentioned previously, the zener diode comprises n-type region 350, epitaxial layer 320, and p-type region 390. The breakdown voltage of the zener diode is a function of doping concentration and the spacing between n-type region 350 and p-type region 390. Epitaxial layer 320 is fully depleted prior to the zener diode voltage breakdown. The breakdown voltage of the zener diode is selected based on the type of transistors or devices being protected on the integrated circuit wafer process flow. Typically, the breakdown voltage is selected to be greater than the operating voltage of the integrated circuit to prevent false triggering under normal operation.

In general, ESD protection circuit 300 acts as a voltage clamp to an ESD event. An ESD event couples a voltage impulse that can measure thousands of volts to circuitry coupled to an I/O of an integrated circuit. ESD protection circuit 300 clamps the voltage to a value that does not damage the circuitry of the integrated circuit and dissipates the energy of the pulse in a short period of time. An ESD event coupled to terminal 400 couples the voltage impulse to n-type region 350. P-type region 390 is initially coupled to ground through base region 430. An impact ionization current is generated as the voltage across the zener diode approaches the zener breakdown voltage of the device. The impact ionization current causes avalanche breakdown to occur in the zener diode (at the breakdown voltage of the device). The impact ionization current is coupled from p-type region 390 into base region 430. P-type region 420 provides subsurface current paths that uniformly redistributes the impact ionization current from the surface of base region 430. Current crowding is greatly reduced. P-type region 420 creates a redistribution of bipolar currents from the surface to flow in a more vertical manner thereby reducing power dissipation in the surface region.

The impact ionization current from the zener diode increases corresponding to the rising voltage of the ESD event. The impact ionization current in base region 430 produces a voltage that forward biases the base-emitter junction of the transistor due to the inherent resistance of the region. The enabled transistor is a high current gain device. A portion of the impact ionization current is base current to the transistor. The transistor multiplies the base current by the current gain ($\beta$) of the vertical transistor and sinks current corresponding to the ESD event. The enabled transistor clamps the voltage of the ESD event from rising and dissipates the energy the impulse.

Figure 5:
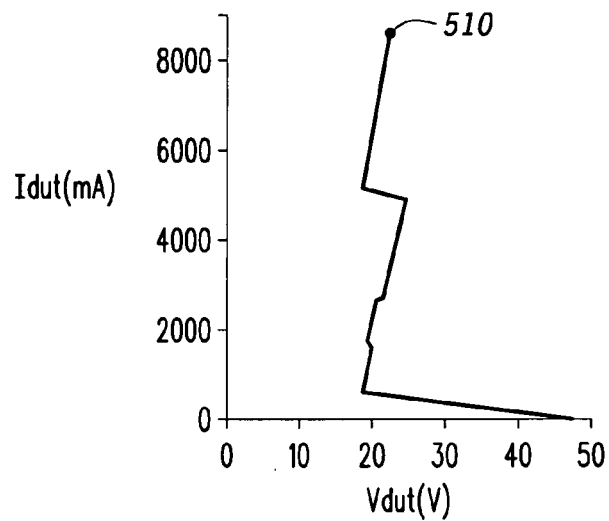
FIG. 5 is a graph of a transmission pulse line characteristic corresponding to ESD protection circuit of FIG. 4.

FIG. 5 is a graph of a transmission pulse line characteristics corresponding to ESD protection circuit 300 of FIG. 4. In general, transmission pulse line testing provides a pulse similar to an ESD event to the ESD protection circuit under test. The data shown is for an ESD protection circuit measuring 52.5 microns on a side. In particular, the ESD protection circuit has parameters similar to that described hereinabove. More specifically, base region 430 is approximately 2.8 microns deep. P-type region 430 is formed approximately 2 microns deep in base region 430. The doping concentration of p-type region 430 is approximately an order of magnitude more than the doping concentration of base region 430. The voltage and current coupled to the ESD protection circuit is monitored. Voltage is displayed on the x-axis of the graph and current on the y-axis of the graph.

An initial voltage impulse is clamped to a voltage magnitude less than 50 volts as the zener diode comprising n-type region 350, n-type epitaxial layer 320, and p-type region 390 breaks down providing impact ionization current to base region 430. The impact ionization current enables the transistor by creating a voltage drop in base region 430 that forward biases the base-emitter junction. A portion of the impact ionization current is base current that is multiplied by the current gain of the transistor thereby rapidly shunting current of the ESD event through a low impedance path to ground. The voltage at terminal 400 continues to fall to approximately the breakdown voltage of the zener diode plus a base-emitter junction voltage. The test equipment measures the maximum current that can be handled by ESD protection circuit 300 before failure. The point of failure is represented by dot 510 on the curve which corresponds to a current slightly greater than 8000 milliamperes.

Figure 3:
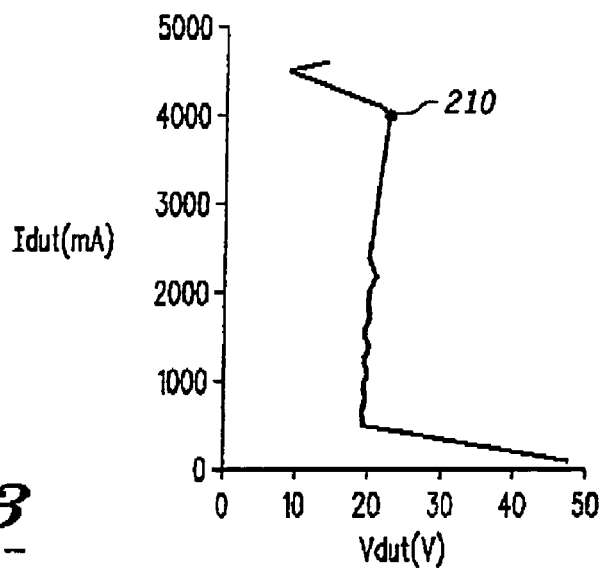
FIG. 3 is a graph of a transmission pulse line characteristic corresponding to the ESD protection circuit of FIG. 2.

ESD protection circuit 300 as tested has the same area as the prior art ESD protection circuit tested in FIG. 3. Note that ESD protection circuit 300 has greater than twice the current handling capability of the prior art ESD protection circuit. Moreover, a difference in failure mechanism occurs that shifts from the base to the collector of the transistor (at 8000 milliamperes the failure occurs at the collector of the transistor). The increase in maximum current that can be handled by ESD protection circuit 300 directly translates to better protection against higher energy ESD events. A further benefit of ESD protection circuit 300 is that the cell size can be reduced while providing the same benefit of the prior art ESD protection circuit thereby reducing the die size of the integrated circuit. ESD protection circuit 300 is easily implemented in many common wafer process flows without the need of extra processing steps. Furthermore, the design is robust and scalable from a processing perspective thereby allowing it to be used in future generation process flows.

Figure 6:
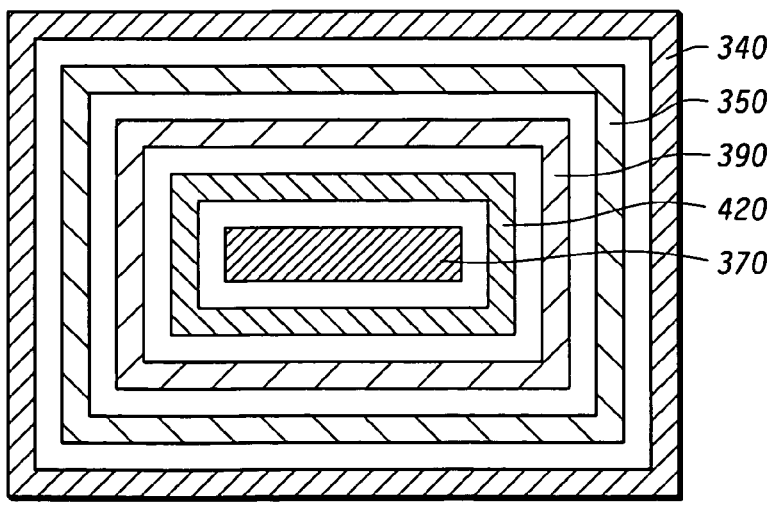
FIG. 6 is a top view of an ESD protection circuit in accordance with the present invention.

FIG. 6 is a top view of an ESD protection circuit 300 in accordance with the present invention. The top view is representative of the ring shapes described in FIG. 4. P-type region 340 is formed in a ring shape that isolates ESD protection circuit 300 from other devices (not shown) of the integrated circuit. The active area in which ESD protection circuit 300 is formed is interior to p-type region 340. P-type region 340 is coupled to ground.

N-type region 350 is formed in a ring shape in the active area and contacts the buried layer (not shown) underlying the base region of the transistor. P-type region 390 is formed in a ring shape interior to the ring shape of n-type region 350. The zener diode comprises p-type region 390, the epitaxial layer (not shown), and n-type region 350. P-type region 390 couples to the base region (not shown). P-type region 420 is interior to the ring shape of p-type region 390. Finally, emitter region 370 is interior to the ring shape of p-type region 370. In general, ESD protection circuit 300 is a symmetrical structure.

While at least one exemplary embodiment has been presented in the foregoing detailed description, it should be appreciated that a vast number of variations exist. It should also be appreciated that the exemplary embodiment or exemplary embodiments are only examples, and ate not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An electrostatic discharge (ESD) protection device having a first terminal and a second terminal, the device comprising:
    a transistor having a collector coupled to the first terminal of the ESD protection device a base and an emitter coupled to the second terminal of the ESD protection device, said transistor having a base region of a first type;
    a zener diode having a first terminal coupled to said collector of said transistor and a second terminal coupled said base of said transistor wherein said zener diode breaks down in an ESD event providing impact ionization current to said base region of said transistor;
    a first region of said first type formed in said base region, said first region configured to redistribute current away from a surface of said base region to increase a peak current handled by the ESD protection device; and
    a second region of said first type formed in said first region, said second region coupling to the second terminal of the ESD protection device.

2. The device as recited in claim 1 further including:
    a substrate of said first type;
    an epitaxial layer of a second type; and an isolation region formed in said epitaxial layer for defining an active area of the ESD protection device, said active area corresponding to said epitaxial layer interior to said isolation region.

3. The device as recited in claim 2 wherein said isolation region is of said first type.

4. The device as recited in claim 3 wherein said isolation region comprises a deep trench.

5. The device as recited in claim 2 further including:
an emitter region of said second type formed in said base region, said emitter region coupling to the second terminal of the ESD protection device;
said first region being spaced a predetermined distance from said emitter region; and said base region formed in said active area;
wherein a depth of said first region into said base region is greater than a depth of said second region.

6. The device as recited in claim 5 wherein said doping concentration of said second region is greater than a doping concentration of said first region.

7. The device as recited in claim 6 wherein said first region is formed in a ring shape and wherein said emitter region is centrally located interior to said ring shape of said first region and wherein a depth of said first region in said base region is greater than a depth of said emitter region.

8. The device as recited in claim 7 further including:
a buried layer of said second type underlying a portion of said active area; and
a third region of said second type spaced a predetermined distance from said base region, said third region coupling to said buried layer and the first terminal of the ESD protection device.

9. The device as recited in claim 8 wherein said third region is formed in a ring shape and wherein said base region is located interior to said ring shape of said third region.

10. The device as recited in claim 9 further including a fourth region of said first type formed overlying a boundary between said base region and said epitaxial layer.

11. The device as recited in claim 10 wherein said zener diode comprises said fourth region, said epitaxial layer, and said third region.

12. A method of protecting a semiconductor device from an electrostatic discharge comprising the steps of:
breaking down a zener diode during an electrostatic discharge (ESD) event such that an impact ionization current is generated; and
enabling a transistor with said impact ionization current to dissipate said ESD event before the semiconductor device is damaged wherein said impact ionization current is distributed uniformly through a base region of said transistor via a first region formed in said base region to prevent current crowding at a surface of said base region, the first region having a doping concentration greater than a doping concentration of said base region and having a second region formed in said first region, the second region having a doping concentration greater than said doing concentration of said first region.

13. The method as recited in claim 12 further including a step of distributing said ionization current below a surface of said transistor.

14. The method as recited in claim 12 further including a step of reducing a resistance in a path of said impact ionization current.

15. An electrostatic discharge (ESD) device having a first terminal and a second terminal, the ESD device comprising:
a substrate of a first type;
an epitaxial layer of a second type overlying said substrate;
an isolation region formed in said epitaxial layer to define an active area of the ESD device;
a base region of said first type formed in said epitaxial layer interior to said isolation region;
an emitter region of said second type formed in said base region, said emitter region coupled to the second terminal;
a first region of said first type formed in said base region adjacent to said emitter region wherein said first region has a depth greater than 30% of a depth of said base region and wherein said first region is coupled to said emitter region;
a second region of said first type formed in said first region; and
a zener diode having a first terminal coupled to said epitaxial layer interior to said isolation region and a second terminal coupled to said base region.

16. The ESD device as recited in claim 15 wherein said first region has a higher doping concentration than said base region and wherein said second region has a higher doping concentration than said first region.

17. The ESD device as recited in claim 16 further including:
a buried layer underlying said base region;
a third region of said second type formed in said epitaxial layer interior to said isolation region, said third region extending from a surface of said epitaxial layer to said buried layer; and
a fourth region of said second type formed in said third region, said fourth region coupling to the first terminal of the ESD device.

18. The ESD device as recited in claim 17 further including a fifth region of said first type overlying a boundary of between said base region and said epitaxial region interior to said isolation region.

19. The ESD device as recited in claim 18 wherein said fifth region and said third region are spaced a predetermined distance apart and wherein said zener diode comprises said third region, said epitaxial region interior to said isolation region, and said fifth region.

20. The ESD device as recited in claim 19 wherein the first terminal of the ESD device couples to circuitry of an integrated circuit to be protected and wherein said the second terminal of the ESD device couples to ground.

* * * * *